(12) United States Patent
Randall

(10) Patent No.: US 6,433,723 B1
(45) Date of Patent: Aug. 13, 2002

(54) ANALOG-TO-DIGITAL CONVERSION WITH REDUCED ERROR

(75) Inventor: Bruce E. Randall, Rock Hills, SC (US)

(73) Assignee: Siemens Power Transmission & Distribution, Inc., Raliegh, NC (US)

(*) Notice: Subject to any disclaimer, the term of this patent is extended or adjusted under 35 U.S.C. 154(b) by 0 days.

(21) Appl. No.: 09/364,577

(22) Filed: Jul. 30, 1999

Related U.S. Application Data
(60) Provisional application No. 60/094,604, filed on Jul. 30, 1998.

(51) Int. Cl.[7] .............................. H03M 1/12; H03M 1/20
(52) U.S. Cl. ........................................ 341/155; 341/131
(58) Field of Search .................................. 341/131, 155

(56) References Cited

U.S. PATENT DOCUMENTS

| | | | | |
|---|---|---|---|---|
| 3,999,129 A | * | 12/1976 | Kasson | 375/243 |
| 4,187,466 A | | 2/1980 | Kasson et al. | |
| 4,395,701 A | * | 7/1983 | Evans | 340/347 |
| 4,700,173 A | | 10/1987 | Araki et al. | |
| 4,761,634 A | | 8/1988 | Yamaguchi et al. | |
| 4,794,369 A | * | 12/1988 | Haferd | 341/166 |
| 4,800,364 A | | 1/1989 | Mortara | |
| 4,831,464 A | * | 5/1989 | Chijiiwa | 360/32 |
| 4,839,650 A | | 6/1989 | Geen et al. | |
| 4,963,881 A | | 10/1990 | Franceschini | |
| 5,073,777 A | * | 12/1991 | Fukuhara et al. | 341/131 |
| 5,525,984 A | * | 6/1996 | Bunker | 341/131 |
| 5,530,442 A | * | 6/1996 | Norsworthy et al. | 341/131 |
| 5,627,536 A | * | 5/1997 | Ramirez | 341/141 |
| 5,675,335 A | | 10/1997 | Keller | |
| 5,940,138 A | * | 8/1999 | Lowe | 348/574 |
| 6,016,113 A | * | 1/2000 | Binder | 341/131 |
| 6,064,328 A | * | 5/2000 | Scheidig et al. | 341/155 |

OTHER PUBLICATIONS

Yamasaki, The Application of Large Amplitude Dither to the Quantization of Wide Range Audio Signals, The Journal of the Accustical Society of Japan, vol. 39, No. 7, Jul. 1983.*

Floyd, Eletronic Devices, Columbus, Ohio, pp. 674–680, 1984.*

* cited by examiner

Primary Examiner—Michael Tokar
Assistant Examiner—James H. Cho

(57) ABSTRACT

An analog-to-digital converter for generating samples at a first sample rate includes a noise generator, a summing circuit, a conversion circuit, and a low pass filter. The noise generator is configured to generate a noise signal having a signal bandwidth, the signal bandwidth including a high frequency that exceeds the first sample rate. The summing circuit is configured to sum the noise signal with an input signal in order to generate a composite signal. The conversion circuit is configured to convert the composite signal to a first digital signal, the conversion circuit using a sampling rate that exceeds the first sample rate. The low pass filter is operable to filter the first digital signal and to generate a second digital signal having the first sample rate.

20 Claims, 3 Drawing Sheets

ANALOG-TO-DIGITAL CONVERSION WITH REDUCED ERROR

The application claims the benefit of the United States Provisional Patent Application No. 60/094,604 filed Jul. 30, 1998.

FIELD OF THE INVENTION

The present invention relates generally to analog-to-digital conversion devices, and in particular, those devices which exhibit error or distortion due to differential non-linearity.

BACKGROUND OF THE INVENTION

Devices that convert analog signals into digital signals for use in digital processing circuitry are commonly referred to as analog-to-digital ("A/D") converters. A/D converters are typically integrated circuits that attempt to approximate the instantaneous value of an analog input signal and assign a digital value to that approximation.

The dynamic range of the A/D converter defines the range of analog input voltage values that may practicably be converted. For example, an A/D converter may be configured to convert signals within a dynamic range of −5V to +5V. In such a case, the A/D converter provides useful digital values only for those input voltages that are within that dynamic range. For any voltage values of below −5V, the A/D converter may simply provide the a zero digital value, and for any voltage above +5V, the A/D converter may provide its maximum digital value.

The sampling rate of the A/D converter typically defines the rate at which the A/D converter produces output digital values or samples. A sampling rate of 10,000 samples/second generally means that the A/D converter measures the input analog signal 10,000 times every second, and produces 10,000 corresponding digital values.

The resolution of the A/D converter refers to the number of different possible digital values that the A/D converter can produce for the dynamic range. An N-bit resolution provides a potential range of $2^N$ values. Thus, an A/D converter having an eight bit resolution produces a range of 256 output values. Each output value is referred to as a quantization step.

Ideally, the digital values produced by the A/D converter are linearly distributed over the dynamic range of the converter. The difference in the input voltage levels represented by adjacent digital output values is referred to as the quantization step value of the converter. Thus, for example, an 8-bit converter having a dynamic range of −5V to +5V would have 256 values to represent the scale of voltages from −5V to +5V. In such an example, the quantization step value would be 10/256 volts or 0.039 volts. Thus, in such a converter, the digital value 0 would represent an analog input voltage of −5.0 to −4.962, the digital value 1 would represent an analog input voltage of −4.961 to −4.923, and so forth.

A/D converters are susceptible to error from many causes, including differential non-linearity. For example, successive approximation A/D converters exhibit significant amounts of differential non-linearity, particularly in low cost implementations of the circuit. Differential non-linearity is a phenomenon in which the range of analog input voltages that generate each digital output value is not uniform for all digital output values.

In particular, as discussed above A/D converters ideally approximate analog inputs by allocating an equivalent input voltage range to each digital output value. In the above example, each digital output value ideally represents a voltage range of approximately 0.039 volts. As a result, the 8-bit converter "covers" the dynamic range of ten volts with 256 digital values.

Because of differential non-linearity, however, individual digital values will be generated for ranges of input voltage values that is more than or less than the ideal voltage range. Thus, referring again to the above example, the digital value 0 may represent a non-ideal range of input voltages from −5V to −4.958V and the digital value 1 may represent a non-ideal range of input voltages from −4.959V to −4.923V. In many circuits, however, a significant amount of differential non-linearity error is tolerable.

Nevertheless, in some circuits, differential non-linearity can result in inaccuracies that are detrimental to the operation of a system. For example, a measurement device that is intended to measure various aspects an input analog signal can provide inaccurate measurements due in part to the differential non-linearity of an A/D converter. One example of such a measurement device is an electrical utility meter.

Utility service providers employ electrical utility meters to measure various values related to energy consumption. The service providers use the measured values for billing and resource allocation purposes, among other things. Because the measured values are used for billing, high standards of accuracy have evolved for the electrical utility meter industry.

Many electrical utility meters utilize A/D converters to convert input analog measurement signals to digital measurement values. The input analog measurement signals are typically signals representative of the actual current and voltage waveforms on the power lines being metered. The A/D converter digitizes the signals and then provides the digital measurement values to digital processing circuitry. The digital processing circuitry performs mathematical operations on the digital measurement values to generate the various metering quantities used by the service provider for billing and other purposes.

In such meters, the differential non-linearity error of the A/D converter can cause error in the measurements that exceeds the allowable standards. One solution to the problems raised by differential non-linearity error in A/D converters is to formulate the A/D converter with high quality, low tolerance components. However, such A/D converters can be significantly more expensive than ordinary successive approximation converters.

A need exists, therefore, for an A/D converter circuit that exhibits a reduced amount of differential non-linear error or distortion without employing high cost, low tolerance components in the converter design.

SUMMARY OF THE INVENTION

The present invention addresses the above need, as well as others, by providing an A/D converter circuit that adds a relatively high frequency noise signal to the input analog signal to spread the differential non-linear error over larger portions of the dynamic range of the A/D conversion device. In addition, the A/D conversion device oversamples the combined analog signal and error signal, thereby allowing the effective resolution and accuracy of the converter circuit to exceed that of the A/D conversion device.

In one embodiment, the present invention includes an analog-to-digital converter for generating samples at a first sample rate. The analog-to-digital converter includes a noise generator, a summing circuit, a conversion circuit, and a low pass filter. The noise generator is configured to generate a noise signal having a signal bandwidth, the signal bandwidth including a high frequency that exceeds the first sample rate. The summing circuit is configured to sum the noise signal with an input signal in order to generate a composite signal. The conversion circuit is configured to convert the composite signal to a first digital signal, the conversion circuit using a sampling rate that exceeds the first sample rate. The low pass filter is operable to filter the first digital signal and generate a second digital signal having the first sample rate.

An exemplary method of converting analog input signals to digital output signals according to the present invention includes a first step of generating a noise signal having a signal bandwidth, the signal bandwidth including a high frequency that exceeds a first sample rate. The exemplary method further includes the steps of summing the noise signal with an input signal in order to generate a composite signal, and converting the composite signal to a first digital signal using a sampling rate that exceeds the first sample rate. Finally, the exemplary method includes the step of filtering the first digital signal and generating a second digital signal having the first sample rate.

The conversion of the input signal after the addition of the noise signal results in the differential non-linearity distortion of the conversion device being effectively spread to different amplitude levels in the input signal. The use of a sampling rate that exceeds the first sample rate of the output digital signal provides the oversampling effect that increases the accuracy of the analog-to-digital conversion.

The above described features and advantages of the present invention as well as others, will become more readily apparent to those of ordinary skill in the art by reference to the following detailed description and accompanying drawings.

DETAILED DESCRIPTION

Figure 1:
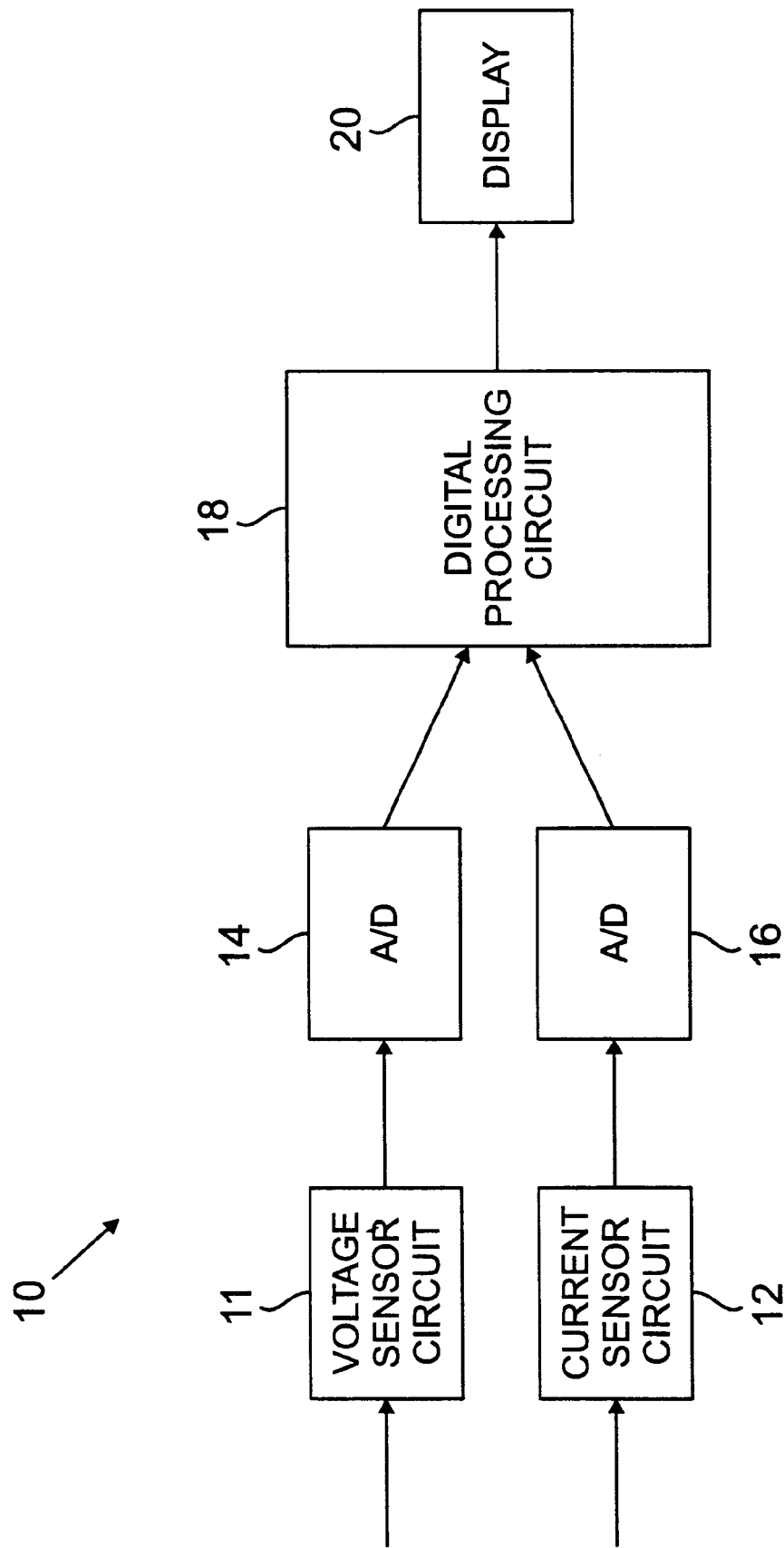
FIG. 1 shows a block diagram of an exemplary electric utility meter employing an analog-to-digital converter according to the present invention.

Although the present invention is advantageously employed in a wide variety of electronic applications in which analog-to-digital (A/D) converters are employed, the present invention is particularly well-suited to the high accuracy demands of electrical utility meters. FIG. 1 shows a block diagram of an exemplary electrical utility meter employing an A/D converter according to the present invention. It will be noted that the electrical utility meter of FIG. 1 is shown in terms of generalized functional blocks, the specific form of which is not relevant to the present invention. Those of ordinary skill in the metering art may readily devise their own particular implementations of the functional blocks. An example of a meter that may be modified by including the A/D converter of the present invention is taught in U.S. Pat. No. 5,627,759 to Bearden et al., which is assigned to the assignee of the present invention and incorporated by reference herein.

The meter 10 includes a voltage sensor circuit 11, a current sensor circuit 12, first and second A/D converters 14 and 16, a digital processing circuit 18, and a display 20. In general, the meter 10 obtains voltage and current waveform signals from the power lines, not shown, and generates a display indicative of a quantity of energy consumed over time on the power lines.

In particular, the voltage sensor circuit 11 is operably connected to the power lines to obtain voltage waveform signals therefrom. The voltage sensor circuit 11 furthermore includes circuitry operable to convert the voltage waveform signals into voltage measurement signals. Voltage measurement signals may suitably be scaled versions of the voltage waveform signals. To this end, the voltage sensor circuit 11 may include, for example, a voltage divider circuit. The voltage sensor circuit 11 is connected to provide the voltage measurement signals to the first A/D converter 14.

The current sensor circuit 12 is operably connected to the power lines to obtain current waveform signals therefrom. The current sensor circuit 12, which may include, for example, a current transformer, an embedded coil, or a shunt, is operable to generate current measurement signals from the current waveform signals. A current measurement signal is a signal having a scaled voltage waveform that is representative of the magnitude and phase of the current waveform signal. The current sensor circuit 12 is operably connected to provide the current measurement signals to the second A/D converter 16.

The first A/D converter 14 is an A/D converter according to the present invention that generates digital samples at a first sample rate. In accordance with the present invention, the first A/D converter 14 includes circuitry that is operable to generate a noise signal having a signal bandwidth that includes a high frequency that exceeds the first sample rate, sum the noise signal with the voltage measurement signal in order to generate a composite signal, convert the composite signal to a first digital signal using a sampling rate that exceeds the first sample rate, filter the first digital signal, and generate a second digital signal having the first sample rate. The first A/D converter 14 is operably connected to provide the second digital signal, which constitutes the digital voltage measurement signal, to the digital processing circuit 18.

It is noted that the first A/D converter 14 may suitably incorporate a prior art A/D conversion circuit having nontrivial differential non-linearity error to perform the conversion on the composite signal to the first digital signal. The first A/D converter 14, however, by adding a noise signal having frequency components exceeding the sample rate of the digital voltage measurement signal, and by converting the composite noise and voltage measurement signal at a sample rate that exceeds the sample rate of the digital voltage measurement signal, effectively reduces the differential non-linearity error otherwise caused by the conversion circuitry. An example of an A/D converter circuit that may be employed as the first A/D converter is discussed below in connection with FIG. 2.

The second A/D converter 16 has a similar structure as the first A/D converter 14, and is similarly operable to generate a digital current measurement signal at the first sample rate.

The digital processing circuit 18 is a circuit that receives the digital voltage measurement signal and the digital current measurement signal and generates energy consumption information therefrom. Such circuits may take various forms and are well known. Typically, however, the digital processing circuit 18 will include one or more elements that effect a watt-hour calculation through multiplication of the digital current measurement signal and the digital voltage measurement signal.

In particular, it is noted that the digital voltage measurement signal and the digital current measurement signal each consist of a series of digital samples, each representative of an instantaneous voltage level or current level of the power line waveforms. It is well-known that energy consumption may be calculated by summing the products of contemporaneous voltage and current samples. In other words, energy W may be given by the following equation:

$$W = \text{sum}(V_n * I_n)$$

where $V_n$ is the voltage sample value of the digital voltage measurement signal at a time n and $I_n$ is the current sample value of the digital current measurement signal at the time n.

Such calculations are readily carried out by digital processing equipment such as a digital signal processor or microprocessor. In any event, the digital processing circuit 18 is typically further operable to convert the value W into standard units of energy consumption information. The digital processing circuit 18 may also be operable to generate other energy consumption information, such as rms voltage, rms current, apparent energy and reactive energy.

The digital processing circuit 18 is connected to provide energy consumption information to the display 20. The display 20 is a circuit that effectuates display of the energy consumption information in human-readable form.

It is noted that if the meter 10, by employing the first and second A/D converters 14 and 16 in accordance with the present invention, provides sufficiently accurate results without incorporating A/D conversion circuitry that is constructed of high cost, low tolerance components.

Figure 2:
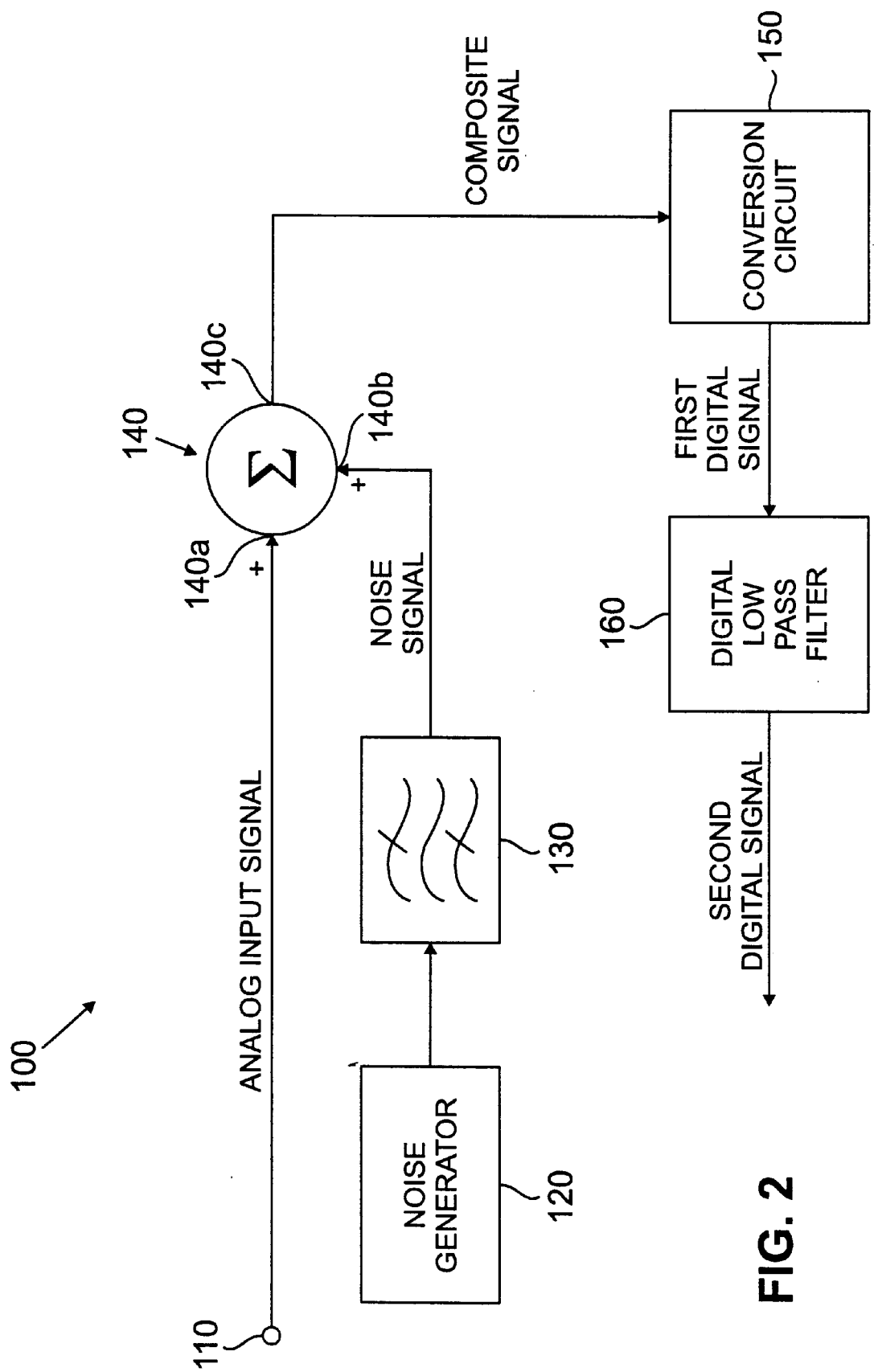
FIG. 2 shows a block circuit diagram of an exemplary analog-to-digital converter according to the present invention.

FIG. 2 shows a block circuit diagram of an exemplary A/D converter 100 according to the present invention. In general, the A/D converter 100 is operable to receive an analog input signal and generate a digital output signal having a first sample rate. The first sample rate is chosen such that it can accurately represent the entire frequency band of interest of the analog input signal. The first sample rate should be in excess of twice the highest frequency of interest in accordance with the Nyquist criteria. In any event, the A/D converter 100 of FIG. 2 includes an input 110, a noise generator 120, a bandpass filter 130, a summing circuit 140, a conversion circuit 150, and a digital low pass filter 160.

The input 110 is preferably coupled to a source of analog input signals, not shown. The input 110 is further connected to a first input 140a of the summation device 140.

The noise generator 120 is a device or circuit that is operable to generate a noise signal having a signal bandwidth, the signal bandwidth including a high frequency that exceeds the first sample rate. Thus, for example, if the first sample rate is 4000 samples/sec, then the signal bandwidth of the noise signal includes a high frequency component in excess of 4 kHz. Preferably, the noise generator 120 is a device that is operable to generate a random or pseudorandom noise signal.

The filter 130 is coupled between the noise generator 120 and a second input 140b of the summation device 140. The filter 130 is configured to have a cut-off frequency above the first sample rate, and a pass band that includes the high frequency of the signal bandwidth of the noise signal. For example, if the first sample rate is 4000 samples/sec, the filter 130 would have a cutoff frequency in excess of 4 kHz. Preferably, the cut-off frequency is substantially above the first sample rate. The purpose of the filter 130 is to generate a filtered noise signal that has only those frequency components that are out of the range of the frequency band of interest of the analog input signal.

The summing circuit 140 is a circuit configured to perform an analog summation of the signals at its first and second inputs 140a and 140b, respectively, and provide the resulting summed or composite signal at its output 140c. The output 140c of the summing circuit 140 is further connected to the conversion circuit 150.

The conversion circuit 150 is a circuit configured to convert the composite signal to a first digital signal. To this end, the conversion circuit 150 employs a sampling rate SR that exceeds the first sample rate. By way of example, if the first sample rate is 4000 samples/sec, then the conversion circuit 150 may suitably have a sampling rate of SR=128 KHz. The conversion circuit 150 may suitably comprise a commercially available successive approximation analog-to-digital converter, which are known to have a non-trivial amount of differential non-linearity. An example of such a device is the ADC 08231 integrated circuit available from National Semiconductor.

The conversion circuit 150 has a dynamic range DR that is analogous to that of any A/D prior art A/D conversion circuit. The conversion circuit 150 furthermore has a first bit resolution BR, for example, an eight bit resolution. However, it will be noted that the A/D converter 100 may readily be modified to operate with conversion circuits 150 having other bit resolutions. It is further noted, that the conversion circuit 150 also has an ideal quantization step value, (the difference between input levels represented by adjacent digital output values) that is defined by the bit resolution and the dynamic range. In particular, the ideal quantization step value is equal to $DR/2^{BR}$. Thus, for example, if the conversion circuit 150 has a dynamic range of −5V to +5V and the bit resolution is eight bits, then the ideal quantization step value is $10/2^8$ or 0.039. However, due to differential non-linearity, the actual quantization step value of one or more quantization steps will be greater than or less than the ideal.

The conversion circuit 150 is operably coupled to provide the first digital signal to the low pass filter 160. The low pass filter 160 is a digital filter configured to filter the first digital signal in order to generate second digital signal. The low pass filter 160 furthermore causes the second digital signal to be produced at the first sample rate, which is less than SR. In particular, the low pass filter 160 both attenuates select frequency components of the first digital signal, and generates one output sample of the second digital signal for every NN input samples of the first digital signal. To this end, the low pass filter 160 may suitably be a decimation low pass filter.

In operation, an analog input signal is provided to the input 110 from the source of analog input signals, not shown. For example, the source could be a voltage sensor circuit or current sensor circuit from an electrical utility meter. The analog input signal propagates to the first input 140a of the summing circuit 140.

Meanwhile, the noise generator 120 generates a noise signal having frequency components in excess of the first sample rate. More particularly, the noise generator 120 generates a noise signal within the passband of the filter 130. The noise signal propagates to the filter 130. The filter 130 substantially attenuates any noise signal energy at frequencies below the cutoff frequency of the filter 130. The band-limited noise signal then propagates from the filter 130 to the second input 140b of the summing circuit 140.

The summing circuit 140 receives both the band-limited noise signal and the analog input signal and generates an analog composite signal therefrom. The summing circuit 140 may also suitably scale the band-limited noise signal and/or the analog input signal to ensure that the signals have a dynamic range suitable for the conversion circuit 150.

More particularly, the analog input signal is preferably scaled such that its peak value is within the dynamic range of the conversion circuit 150. To this end, the analog input signal may be scaled before it arrives at the input 110, scaled by the summing circuit 140, or both. In addition, the band-limited noise signal is scaled such that it has peak value that is greater than one quantization step value of the conversion circuit. Preferably, the band-limited noise signal is scaled such that it has a peak value equivalent to a plurality of quantization step values, but still substantially less than the dynamic range DR. Thus, for example, if the quantization step value is 0.039 volts, the band limited noise signal is scaled such that its peak value is greater than 0.039, and preferably on the order of the 0.1 to 0.3 volts. The use of a noise signal having a peak amplitude that is equivalent to a plurality of quantization step values ensures that the differential non-linearity error is spread several quantization step values away from the quantization step that originated the error.

In any event, the resulting composite signal consists of an analog signal have frequency components below the cutoff frequency of the filter 130 and frequency components above the cutoff frequency of the filter 130. The frequency components below the cutoff frequency are composed primarily of the input analog signal while the frequency components above the cutoff frequency are composed primarily of the noise signal.

The summing circuit 140 provides the composite signal to the conversion circuit 150 through the output 140c. The conversion circuit 150 converts the composite signal to a first digital signal using the relatively high sampling rate SR. The first digital signal is composed of a series of first digital signal samples, each sample being a BR-bit value that is representative of an instantaneous magnitude level of the composite signal. The conversion circuit 150 generates such a first digital signal sample every 1/SR seconds.

The conversion circuit 150 provides the first digital signal to the digital low pass filter 160. The digital low pass filter 160 then filters the first digital signal and generates a second digital signal having the first sample rate. The second digital signal, analogous to the first digital signal, is composed of a series of samples, in this case, second digital signal samples, each sample representative of the instantaneous value of the input signal.

However, unlike the first digital signal, the second digital signal is composed of samples generated at the first sample rate FSR, which is substantially less than the sample rate SR of the first digital signal. To this end, the digital low pass filter 160 generates a second digital sample for every SR/FSR or NN first digital signal samples.

Moreover, the digital low pass filter 160 effectively filters out substantially all of the noise signal components using digital low pass filtering methods which are well known in the art. To this end, the cut-off frequency of the low pass digital filter 160 is chosen such that it is lower than the signal bandwidth of the band-limited noise signal produced by the filter 130. Because the added noise signal is subsequently filtered out by the digital low pass filter 160, the noise signal can produce the effect of spreading the differential non-linearity error to different parts of the input analog signal without adding noise to the output second digital signal.

Moreover, because the composite signal is effectively oversampled (i.e. the conversion circuit 150 uses a higher rate than is produced in the output second digital signal), the second digital signal can have a greater effective bit resolution. Namely, the digital low pass filter can generate a second digital signal having a bit resolution in excess of BR because of the oversampling of the first digital signal. As a result, the A/D converter 100 has a much higher resolution, as well as reduced differential non-linearity distortion, than would be possible through use of the conversion circuit 150 alone. Moreover, the A/D converter 100 includes the above described advantages more economically than attempting to use an A/D conversion circuit with high cost, low tolerance components.

The economic advantages of the present invention are even more emphasized if one or more of the functional blocks of the A/D converter 100, such as for example, the noise generator 120 and/or the digital low pass filter 160, utilize resources already present in the product in which the A/D converter 100 is employed. For example, if the A/D converter 100 is utilized in connection with a digital signal processor, the digital low pass filter 160 may be added by simply configuring the existing digital signal processor to perform that low pass filtering and decimation function. Those of ordinary skill in the art may readily configure a commercially available digital signal processor to carry out the operations described above in connection with the digital low pass filter 160.

Figure 3:
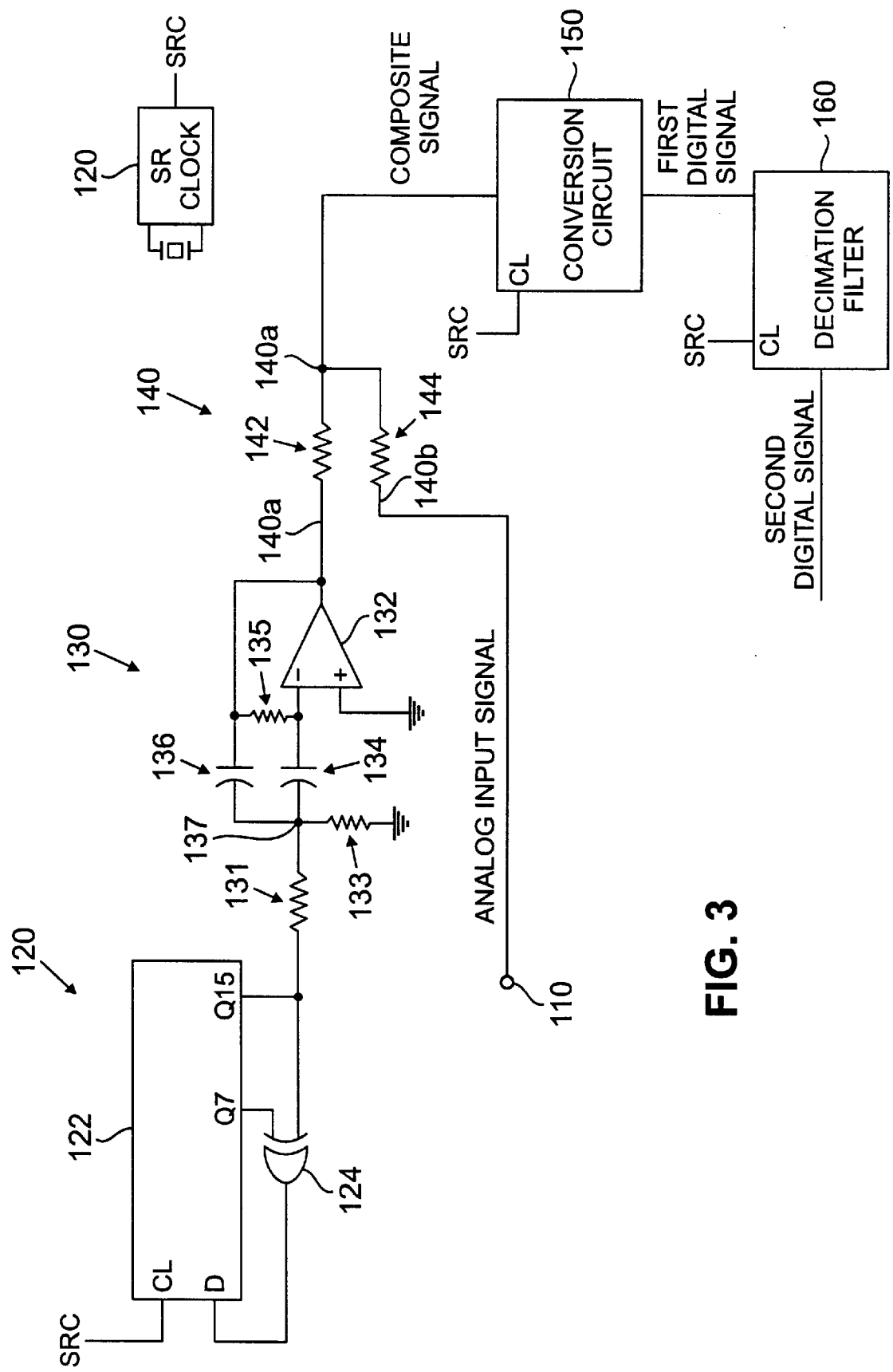
FIG. 3 shows a more detailed block circuit diagram of one embodiment of the analog-to-digital converter of FIG. 1.

FIG. 3 shows a more detailed block circuit diagram of one embodiment of the A/D converter 100 of FIG. 1. Like reference numbers will be used to describe like components. In addition to the input 110, the noise generator 120, the filter 130, the summing circuit 140, the conversion circuit 150, and the decimation filter 160, the A/D converter 100 further includes a clock 170 that is operable to generate a clock signal at an output SRC. The clock signal has a clock rate or pulse rate that is equivalent to the sample rate SR of the conversion circuit 150. In the exemplary embodiment of FIG. 3, SR is equal to 128,000 samples/sec. Accordingly, the clock signal preferably has a clock rate of 128 kHz.

Referring to FIG. 3, the noise generator 120 in the exemplary embodiment discussed herein is a pseudo-random sequence generator. To this end, the noise generator 120 may suitably include a sixteen bit shift register 122 and an exclusive-or gate 124 configured in a well known manner to generate a pseudo-random pulse sequence. For example the $7^{th}$ and $15^{th}$ outputs Q7 and Q15, respectively of the shift register 122 may be tied to the data input D of the shift register 122 through the exclusive-or gate 124. The shift register 122 also includes a clock input CL that is connected to the clock output SRC. The noise generator 120 is operable to generate the pseudo-random pulse sequence at a generator sample rate defined by the clock signals received at its clock input CL.

The output of the noise generator 120 is the $15^{th}$ output Q15 of the shift register 122. The output Q15 is coupled to an input impedance 131 of the filter 130. In the exemplary embodiment of FIG. 3, the filter 130 is configured as an operational amplifier bandpass filter. To this end, the filter 130 comprises the input resistor 131, an operational amplifier ("op-amp") 132, a bias resistor 133, an input capacitor 134, a feedback resistor 135 and a feedback capacitor 136.

The input resistor 131 is coupled between the output Q15 of the noise generator 120 and an input junction 137 of the filter 130. The bias resistor 133 is coupled between the input junction 137 and ground. The input capacitor 134 is coupled between the input junction 137 and a first differential input of the op-amp 132. The second differential input of the op-amp 132 is coupled to ground. The feedback capacitor 136 is coupled between the output of the op-amp 132 and the input junction 137. The feedback resistor 135 is coupled between the output of the op-amp 132 and the first differential input of the op-amp 132.

The values of the capacitors 134, 136 and the resistors 131, 133 and 136 are preferably selected to define a bandpass filter having a center frequency of approximately 50 kHz and a Q value of between 2 and 5. Those of ordinary skill in the are may readily determine appropriate values for the components to have the above listed characteristics.

The output of the op-amp 132 of the filter 130 is coupled to the input 140b of the summing circuit 140. The summing circuit 140 include an first resistor 142 coupled between the first input 140a and the output 140c and a second resistor 144 coupled between the second input 140b and the output 140c. The resistors 142 and 144 are selected to have values that appropriately scale the input analog signal and the noise signal before combining the signals and providing the combined signal the conversion circuit 150. As discussed above, the analog input signal should be scaled such that its maximum value is approximately equal to, and preferably slightly less than, the dynamic range of the conversion circuit 150. The noise signal should be scaled such that its maximum value exceeds one quantization step value of the conversion circuit 150, and preferably is equivalent to at least a few quantization step values. Also, it is advantageous to scale the analog input voltage and the noise signal such that the peak values of the resulting composite signal do not exceed the dynamic range DR of the conversion circuit 150. Those of ordinary skill in the art may readily determine the appropriate values of the resistors 142 and 144 based on the quantization step value of the conversion circuit 150, the dynamic range of the conversion circuit 150, and the ranges of the analog input signal and the noise signal.

The conversion circuit 150 is preferably a commercially available successive approximation converter integrated circuit having a clock input CL. The conversion circuit 150 is operable to generate a first digital signal at its output at a sample rate of 128 kHz. In the embodiment described herein, the conversion circuit 150 has a ten volt dynamic range and an eight bit resolution.

The digital low pass filter 160 is preferably a decimation filter which may suitably be implemented as part of a digital signal processor. The digital low pass filter 160 is operable to receive a first digital signal having a sample rate of 128,000 samples/sec and provide a filtered, second digital signal having a sample rate of 4000 samples/sec at its output. Moreover, the digital low pass filter 160 is preferably operable to generate second digital signal samples having a sixteen bit resolution at its output. The coefficients of the digital low pass filter 160 are advantageously selected to effectively have a cut-off frequency such that frequency components exceeding the first sample rate, or in other words, in excess of 4 kHz, are substantially attenuated. Preferably, the coefficients of the digital low pass filter 160 are chosen such that the bandwidth of the second digital signal is substantially the same as frequency band of interest of the analog input signal.

In operation, an input analog signal is provided to the input 110 from an external source, not shown. The input analog signal propagates to the first input 140a and through the first resistor 142 of the summing circuit 140.

Meanwhile, the noise generator 120 generates a noise signal having frequency components in excess of the first sample rate. More particularly, the shift register 122 performs a shift operation with every clock cycle of the 128 kHz clock. At every clock cycle, the output Q15 obtains a new bit (shifted from the preceding output buffer) and provides the bit as an output to the filter 130. The Q15 output bit is also provided, along with the Q7 output bit, to the exclusive-or gate 124. The exclusive-or gate 124 subsequently provides the result of the exclusive-or combinatorial operation applied to the Q15 and Q7 outputs to the data input D. The ongoing operation of the noise generator 120 thus produces a pseudo-random pulse sequence at the Q15 output. It is noted that the resulting noise signal consists of a pulse signal that transitions between a logic low and logic high voltage level in a pseudo-random sequence. As a result, the noise signal in the above described embodiment typically comprises an analog signal that transitions between approximately zero and five volts in a pseudo-random sequence.

This noise signal propagates to the filter 130. The filter 130 substantially attenuates any noise signal energy below its cutoff frequency of the filter 130. In any event, the noise signal will have little or no appreciable frequency components below the frequency associated with the first sample rate, or 4 kHz. The band-limited noise signal then propagates from the filter 130 to the second input 140b of the summing circuit 140.

The first and second resistors 142 and 144 adjust the respective levels of the noise signal and the analog input signal. The adjusted signals propagate to the output 140c of the summing circuit 140 where they are combined into a single composite signal. As discussed above in connection with FIG. 2, the composite signal consists of an analog signal have frequency components below the cutoff frequency of the filter 130 and frequency components above the cutoff frequency of the filter 130. The frequency components below the cutoff frequency are composed primarily of the input analog signal while the frequency components above the cutoff frequency are composed primarily of the noise signal.

The summing circuit 140 provides the composite signal to the conversion circuit 150 through the output 140c. The conversion circuit 150 converts the composite signal to a first digital signal using a sampling rate of SR=128 kHz. Each sample of the first digital signal is an eight-bit digital value representative of an instantaneous magnitude level of the composite signal. In accordance with the above discussed sampling rate, the conversion circuit 150 generates such a first digital signal sample every $1/128,000^{th}$ of a second.

The conversion circuit 150 provides the first digital signal to the digital low pass filter 160. The digital low pass filter 160 then filters the first digital signal and generates a second digital signal having a sample rate of 4000 samples/sec. Each sample of the second digital signal is a sixteen-bit value that is representative of the instantaneous value of the input signal.

The exemplary embodiment described above illustrates a particular example of an A/D converter 100 that has the features and advantages described above in connection with FIG. 2. It will be appreciated, however, that those of ordinary skill in the art may readily employ other devices and combinations of devices that carry out the functions ascribed to the circuit blocks of FIG. 2. For example, the noise generator 120 may take several forms, such as a thermal noise signal generator or a digital random number generator combined with a digital to analog converter. One purely random noise source that may be used is a noise diode, which is a zener diode that generates white noise. An example of such a noise diode is a model NC104 available Noise/Com. Likewise, the filter 130 may suitably take on various other forms which would be well known in the art.

It is also noted that the A/D converter 100 of the present invention may be readily modified for time-sharing use by several input signal sources. In many devices, such as a utility meter, an A/D converter may be used to convert a plurality of analog input signals by time-division multiplexing the input of the A/D converter. For example, in FIG. 1, the second A/D converter 16 may be eliminated if the voltage and current measurement signals are multiplexed and provided to the first A/D converter 14. It is noted however, that the A/D converter 100 of FIG. 2 may require modification to handle such time division multiplexed signals. In particular, it would be preferable to use separate digital filters for each of the input signals instead of the single digital filter 160. Nevertheless, multiple digital filters are readily implemented in a digital signal processing circuit.

It will further be noted that all of the above described embodiments are merely exemplary, and that those of ordinary skill in the art may readily devise their own implementations that incorporate the principles of the present invention and fall within the spirit and scope thereof.

I claim:

1. An analog-to-digital converter for generating samples at a first sample rate, the analog-to-digital converter comprising:
    a noise generator operable to generate a noise signal having a signal bandwidth, the signal bandwidth including a high frequency that exceeds the first sample rate, the noise generator operable to generate the noise signal based on a clock signal, the clock signal frequency exceeding the first sample rate;
    a summing circuit configured to sum the noise signal with an input signal in order to generate a composite signal;
    a conversion circuit for converting the composite signal to a first digital signal, the conversion circuit using a sampling rate that exceeds the first sample rate; and
    a low pass filter operable to filter the first digital signal and generate a second digital signal having the first sample rate.

2. The analog-to-digital converter of claim 1 wherein the noise generator comprises a pseudo-random noise sequence generator having a generator sample rate that exceeds the first sample rate.

3. The analog-to-digital converter of claim 1 further comprising a filter coupled between the noise generator and the summing circuit, the filter having a cut-off frequency above the first sample rate, and a pass band above the cut-off frequency.

4. The analog-to-digital converter of claim 3 wherein the filter includes an operational amplifier.

5. The analog-to-digital converter of claim 1 wherein the conversion circuit includes a successive approximation conversion circuit.

6. The analog-to-digital converter of claim 1 wherein the low pass filter is a decimation filter.

7. The analog-to-digital converter of claim 1 wherein the noise generator further comprises:
    a shift register having a first signal output, a second signal output, a data input and a clock input; and
    a combinatorial gate having a first input, a second input, and an output, the first input coupled to the first signal output, the second input coupled to the second signal output, and the output coupled to the data input.

8. The analog-to-digital converter of claim 7 wherein the combinatorial gate comprises an exclusive-or gate.

9. The analog-to-digital converter of claim 1, where the summing circuit is configured to sum the noise signal with the input signal in order to generate a composite signal, the input signal constituting a current measurement signal in an electricity meter.

10. A method of converting analog input signals to digital output signals having a first sample rate, the method comprising the steps of:
    a) generating a noise signal having a signal bandwidth, the signal bandwidth including a high frequency that exceeds the first sample rate;
    b) filtering the noise signal using a filter having a cut-off frequency above the first sample rate and a pass band above the cut-off frequency;
    c) summing the noise signal with an input signal in order to generate a composite signal;
    d) converting the composite signal to a first digital signal using a sampling rate that exceeds the first sample rate; and
    e) filtering the first digital signal and generating a second digital signal having the first sample rate.

11. The method of claim 10 wherein step a further comprises the step of employing a pseudo-random noise sequence generator to generate the noise signal.

12. The method of claim 10 wherein step c further comprises converting the composite signal to the first digital signal using a successive approximation conversion circuit.

13. The method of claim 10 wherein step d further comprises filtering the first digital signal to generate second digital signal using a decimation filter.

14. An analog-to-digital converter for generating samples at a first sample rate, the analog-to-digital converter comprising:
    a signal generator operable to generate a signal having a signal bandwidth, the signal bandwidth including a high frequency that exceeds the first sample rate;
    a summing circuit configured to sum the signal with an input signal in order to generate a composite signal;
    a filter coupled between the generator and the conversion circuit, the filter having a cut-off frequency above the first sample rate, and a pass band above the cut-off frequency;
    a successive approximation conversion circuit for converting the composite signal to a first digital signal, the successive approximation conversion circuit using a sampling rate that exceeds the first sample rate; and
    a low pass filter operable to filter the first digital signal and generate a second digital signal having the first sample rate.

15. The analog-to-digital converter of claim 14 wherein the signal generator comprises a pseudo-random noise sequence generator.

16. The analog-to-digital converter of claim 14 wherein the filter comprises a band pass filter.

17. The analog-to-digital converter of claim 14 wherein the filter is coupled between the noise generator and the summing circuit.

18. The analog-to-digital converter of claim 14 wherein the low pass filter is a decimation filter.

19. The analog-to-digital converter of claim 14 wherein the filter includes an operational amplifier.

20. The analog-to-digital converter of claim 14 wherein the noise generator further comprises:
    a shift register having a first signal output, a second signal output, a data input and a clock input; and
    a combinatorial gate having a first input, a second input, and an output, the first input coupled to the first signal output, the second input coupled to the second signal output, and the output coupled to the data input.

* * * * *